(12) United States Patent
Yousif et al.

(10) Patent No.: US 10,204,805 B2
(45) Date of Patent: Feb. 12, 2019

(54) THIN HEATED SUBSTRATE SUPPORT

(71) Applicant: Applied Materials, Inc., Santa Clara, CA (US)

(72) Inventors: Imad Yousif, San Jose, CA (US); Martin Jeffrey Salinas, Campbell, CA (US); Paul B. Reuter, Austin, TX (US); Aniruddha Pal, Santa Clara, CA (US); Jared Ahmad Lee, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 153 days.

(21) Appl. No.: 15/222,689

(22) Filed: Jul. 28, 2016

(65) Prior Publication Data

US 2017/0040192 A1 Feb. 9, 2017

Related U.S. Application Data

(63) Continuation of application No. 13/985,497, filed as application No. PCT/US2012/024524 on Feb. 9, 2012, now abandoned.

(Continued)

(51) Int. Cl.
*H05B 3/68* (2006.01)
*H01L 21/67* (2006.01)
(Continued)

(52) U.S. Cl.
CPC ...... *H01L 21/67103* (2013.01); *H01L 21/263* (2013.01); *H01L 21/324* (2013.01);
(Continued)

(58) Field of Classification Search
CPC ............ H01L 21/263; H01L 21/324; H01L 21/67103; H01L 21/67109;
(Continued)

(56) References Cited

U.S. PATENT DOCUMENTS 4,139,051 A 2/1979 Jones et al.
5,376,213 A 12/1994 Ueda et al.
(Continued)

FOREIGN PATENT DOCUMENTS

JP 62-242441 A 11/1987
JP H5-228873 9/1993
(Continued)

OTHER PUBLICATIONS

Japanese Office Action with English Translation, Application No. 2013-556639, dated Sep. 6, 2016, Consists of 6 pages.

(Continued)

*Primary Examiner* — Sang Y Paik
(74) *Attorney, Agent, or Firm* — Patterson + Sheridan, LLP

(57) ABSTRACT

The present disclosure relates to an apparatus for heating and supporting a substrate in a processing chamber. A substrate support assembly includes a heated plate having a substrate supporting surface on a front side and a cantilever arm extending from a backside of the heated plate. The heated plate is configured to support and heat a substrate on the substrate supporting surface. The cantilever arm has a first end attached to the heated plate near a central axis of the heated plate, and a second end extending radially outwards from the central axis.

19 Claims, 9 Drawing Sheets

Related U.S. Application Data

(60) Provisional application No. 61/448,018, filed on Mar. 1, 2011.

(51) Int. Cl.
*H01L 21/683* (2006.01)
*H01L 21/687* (2006.01)
*H01L 21/263* (2006.01)
*H05B 3/00* (2006.01)
*H01L 21/324* (2006.01)

(52) U.S. Cl.
CPC .. *H01L 21/67109* (2013.01); *H01L 21/67248* (2013.01); *H01L 21/6838* (2013.01); *H01L 21/68792* (2013.01); *H05B 3/00* (2013.01)

(58) Field of Classification Search
CPC ........... H01L 21/67248; H01L 21/6838; H01L 21/68792; H05B 3/00
USPC .......................................... 219/443.1–468.2
See application file for complete search history.

(56) References Cited

U.S. PATENT DOCUMENTS

| | | | |
|---|---|---|---|
| 5,522,937 A | 6/1996 | Chew et al. | |
| 5,633,073 A | 5/1997 | Cheung et al. | |
| 5,753,891 A | 5/1998 | Iwata et al. | |
| 6,035,101 A | 3/2000 | Sajoto et al. | |
| 6,299,691 B1 | 10/2001 | Oda et al. | |
| 6,466,426 B1 | 10/2002 | Mok et al. | |
| 6,616,767 B2 | 9/2003 | Zhao et al. | |
| 7,045,014 B2 | 5/2006 | Mahon et al. | |
| 7,396,480 B2 * | 7/2008 | Kao | H01J 37/32082 216/58 |
| 2009/0031955 A1 | 2/2009 | Lu et al. | |
| 2009/0179365 A1 | 7/2009 | Lerner et al. | |

FOREIGN PATENT DOCUMENTS

TW 201102455 A 1/2011
WO WO-2012118606 A2 9/2012

OTHER PUBLICATIONS

International Search Report, PCT/US2012/024524, dated Sep. 7, 2012.
Chinese Office Action (with attached English translation) for Application No. 201280011157.3 dated Jun. 26, 2015; 9 total pages.
Japanese Office Action dated Dec. 15, 2015, for Japanese Patent Application No. 2013-556639.
Taiwan office Action dated Mar. 31, 2016 for Application No. 101106557.
Korean Office Action (with attached English translation) for Application No. 10-2013-7024723; dated Mar. 27, 2018; 14 total pages.
Korean Office Action with English Translation from KR 10-2013-7024723 dated Sep. 10, 2018.

* cited by examiner

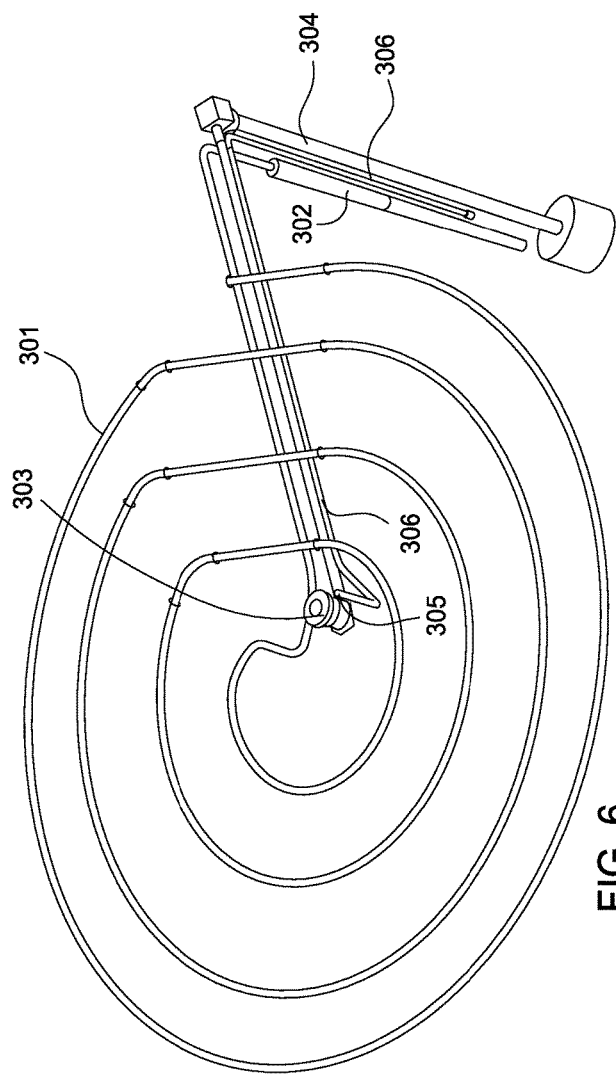
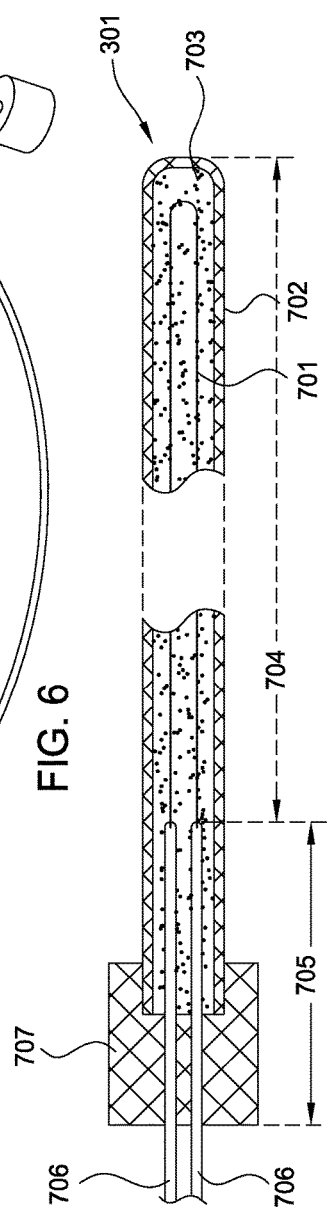
FIG. 6
FIG. 7

THIN HEATED SUBSTRATE SUPPORT

BACKGROUND

Field

Embodiments of the present invention generally relates to a method and apparatus for fabricating devices on a semiconductor substrate. More particularly, embodiments of the present invention provide method and apparatus for heating and supporting a substrate in a processing chamber.

Description of the Related Art

During manufacturing of semiconductor devices, a substrate is usually processed in a processing chamber, where deposition, etching, thermal processing may be performed to the substrate.

A semiconductor processing chamber generally includes a chamber body defining an inner volume for processing a substrate. A substrate support is usually disposed in the inner volume to support the substrate during processing. Sometimes, when the process requires the substrate to be at an elevated temperature, a heated substrate support is generally used in a processing chamber.

A heated substrate support usually includes a substrate supporting plate for supporting and heating a substrate. When heated, the substrate supporting plate may be at a very high temperature. But it is generally desirable to keep the chamber body cool during processing. To prevent the substrate supporting plate from heating the chamber body, the substrate supporting plate is usually positioned at a distance from the chamber body and does not contact the chamber body. A pedestal design having a supporting column extending from a center back of the substrate supporting plate is usually to position the substrate supporting plate away from the chamber body. The column provides structural support to the substrate supporting plate and also provides a passage for wirings to the substrate supporting surface. Generally, the column extends down and out of the processing volume through a bottom wall of the chamber body.

However, the traditional heated substrate supports described above requires relative large inner volume in a processing chamber and is not practical for any processing chamber. Particularly, when a chamber volume is small or it is not desirable to form a center opening through the bottom wall of the chamber body, traditional heated substrate supports are not applicable.

Therefore, there is a need for methods and apparatus for heating and supporting a substrate in a small chamber.

SUMMARY

Embodiments of the present invention generally provide apparatus and methods for processing a substrate. More particularly, embodiments of the present invention provide a thin heated substrate support for heating and supporting a substrate in a processing chamber.

One embodiment of the present invention provides a substrate support assembly. The substrate support assembly includes a heated plate having a substrate supporting surface on a front side and a cantilever arm extending from a backside of the heated plate. The heated plate is configured to support and heat a substrate on the substrate supporting surface. The cantilever arm has a first end attached to the heated plate near a central axis of the heated plate, and a second end extending radially outwards from the central axis.

Another embodiment of the present invention provides substrate support assembly that includes a heated plate having a front side and a backside, a heating element disposed in the heated plate, and at least one bi-metal joint thermally isolating the heated plate.

Another embodiment of the present invention provides a chamber for processing a substrate. The chamber includes a chamber body defining a chamber volume therein and a substrate support assembly disposed in the chamber volume. The substrate support assembly includes a heated plate having a substrate supporting surface on a front side and a cantilever arm extending from a backside of the heated plate. The heated plate is configured to support and heat a substrate on the substrate supporting surface. The cantilever arm has a first end attached to the heated plate near a central axis of the heated plate, and a second end extending radially outwards from the central axis.

Yet another embodiment of the present invention provides a method for processing a substrate. The method includes placing the substrate a substrate supporting surface of a substrate support assembly. The substrate support assembly is supported by a thermal insert disposed in a processing chamber so that the substrate support assembly does not directly contact a chamber body. The substrate support assembly includes a heated plate having the substrate supporting surface on a front side and a cantilever arm extending from a backside of the heated plate. The heated plate is configured to support and heat a substrate on the substrate supporting surface. The cantilever arm has a first end attached to the heated plate near a central axis of the heated plate, and a second end extending radially outwards from the central axis. The method further includes and heating the substrate using the heated plate, includes cooling the chamber body by supplying a cooling fluid to a cooling adaptor connected to the heated support assembly and the chamber body.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 6 is a schematic perspective view of the wiring of the heated substrate support assembly according to one embodiment of the present invention.

FIG. 7 is a schematic sectional view of a heater according to one embodiment of the present invention.

To facilitate understanding, identical reference numerals have been used, where possible, to designate identical elements that are common to the figures. It is contemplated that elements disclosed in one embodiment may be beneficially utilized on other embodiments without specific recitation

DETAILED DESCRIPTION

Embodiments of the present invention provide apparatus and methods for supporting and heating a substrate in a substrate processing chamber. More particularly, embodiments of the present invention relate to a heated substrate support assembly for use in a processing chamber. The heated substrate support assembly can be used in other processing chambers. However, the heated substrate support assembly is particularly beneficial to chambers with small in volume where the low profile of the heated substrate support assembly allows for smaller chamber volumes, and consequently faster pumping using smaller, less costly pumps. For example, the heated substrate support assembly can be used in a load lock chamber for heating and supporting a substrate. The heated substrate support assembly allows the load lock chamber to perform halogen removal or ashing process, thus, improving system throughput without having any impact on abatement or photoresist removal process.

Embodiments of the present invention provide a thin heated substrate support assembly including a heating element. In one embodiment, the heating element is configured to heat up to 300 degrees Celsius. The heated substrate support assembly may be made of aluminum, bi-metal joints, and stainless steel. By combining aluminum, bi-metal and stainless steel, an improved temperature uniformity and reduced heat transfer between the heated substrate support assembly and the chamber body are obtained, while allowing faster heater response with less wattage. In one embodiment, a bellows is used in the heated substrate support to provide flexibility and thermal break which prevents lateral forces due to thermal expansion from stressing and/or displacing the substrate support assembly. In one embodiment, the heated substrate support includes a pumping pipe for vacuum chuck.

In one embodiment, a heated plate of the substrate support assembly is secured inside the chamber body along with an insulator which eliminates direct contact between the heated plate and the chamber body. In one embodiment, a cooling adaptor is connected to both the substrate support assembly and the chamber body near where the substrate support assembly exits the chamber body. The cooling adaptor provides heat insulation between the chamber body and the substrate support assembly and vacuum seal to the chamber, while allowing faster heater response with less wattage.

Figure 1:
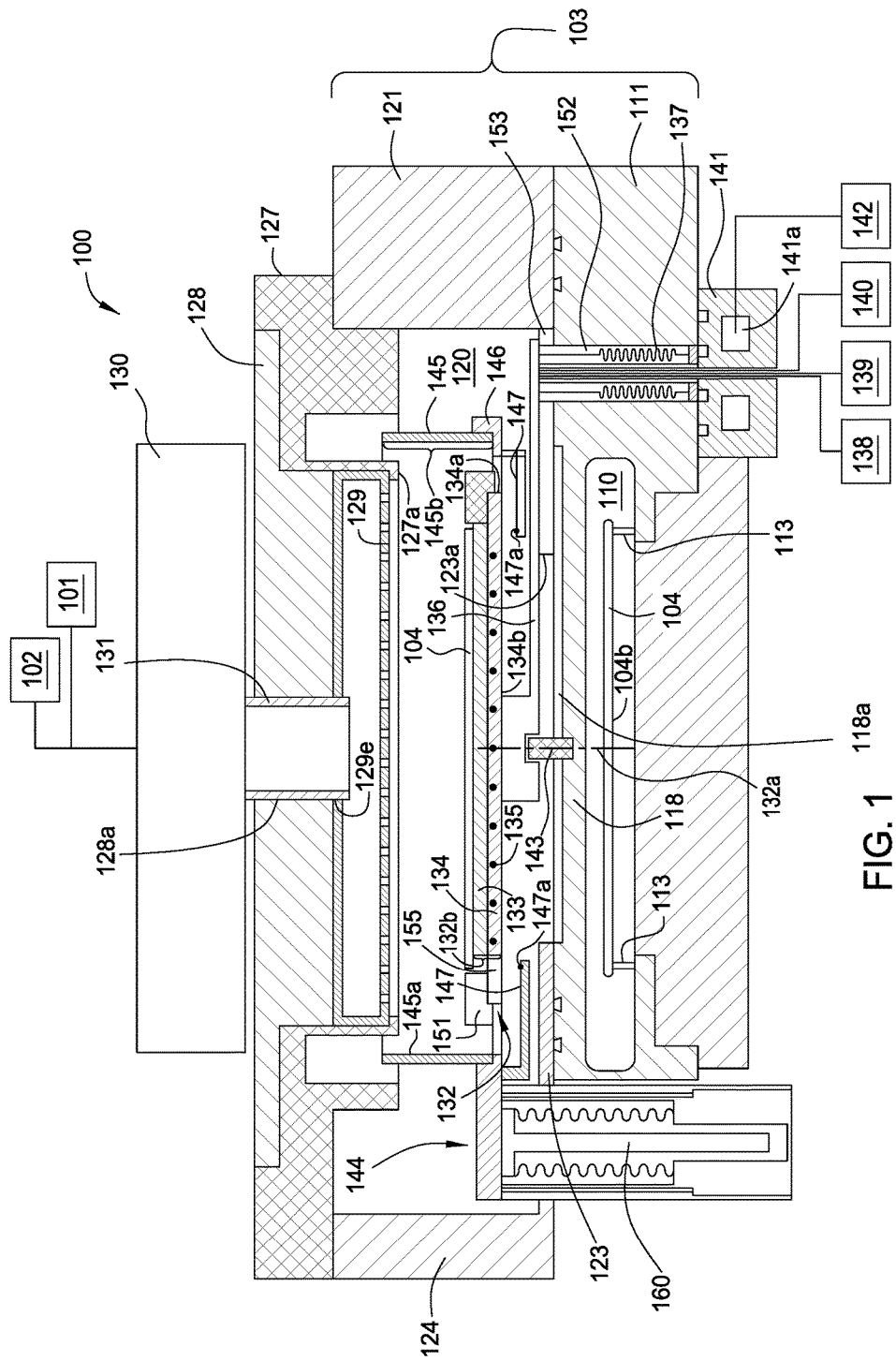
FIG. 1 is a schematic sectional view of a load lock chamber having a heated substrate support assembly according to one embodiment of the present invention.

FIG. 1 is a schematic sectional view of a dual load lock chamber 100 according to one embodiment of the present invention. The dual load lock chamber 100 includes an upper chamber volume 120 for transferring and processing a substrate 104, and a lower chamber volume 110 for transferring a substrate 104. The upper chamber volume 120 and the lower chamber volume 110 are vertically stacked and are fluidly isolated from one another. Each of the each of the lower and upper load lock volumes 110, 120 may be selectively connectable to two separate environments through two openings configured for substrate transferring, for example an atmospheric environment of a factory interface and a vacuum environment of a transfer chamber.

The dual load lock chamber 100 includes a chamber body 103. In one embodiment, the chamber body 103 includes an upper chamber body 121 and a lower chamber body 111 coupled together to define the upper and lower chamber volumes 120, 110 and pumping channels.

The dual load lock chamber 100 may include a showerhead 129, a heated substrate support assembly 132, and a lift hoop assembly 144 disposed within the upper chamber volume 120. The showerhead 129 is disposed over the heated substrate support assembly 132, while the lift hoop assembly 144 is configured to confine a processing environment in the upper chamber volume 120, as well as load and unload substrates. The dual load lock chamber 100 may include supporting pins 113 for supporting a substrate in the lower chamber volume 110.

The upper chamber volume 120 is defined by sidewalls 124 of the upper chamber body 121, a lid liner 127 disposed over the sidewalls 124, a bottom wall 123 of the upper chamber body 121, and an upper wall 118 of the lower chamber body 111. The lid liner 127 has an inner lip 127a holding a showerhead 129 and a source adapter plate 128. The source adapter plate 128 has a central opening 128a matches with a central opening 129e of the showerhead 129. A remote plasma source 130 is in fluid communication with the upper chamber volume 120 through a quartz insert 131 and the showerhead 129.

The remote plasma source 130 is generally connected to one or more gas panels. In one embodiment, the remote plasma source 130 is connected to a first gas panel 101 configured for providing processing gases for an abatement process to remove residual material after etching and a second gas panel 102 configured for providing processing gases for an ashing process to remove photoresist.

The dual load lock chamber 100 further includes a heated substrate support assembly 132 disposed in the upper chamber volume 120 for supporting and heating the substrate 104. A focus ring 151 may be disposed on an outer edge of the heated substrate support assembly 132. The focus ring 151 functions to retain the substrate 104 and to modify processing rate around an edge area of the substrate 104 during processing.

The dual load lock chamber 100 also includes the lift hoop assembly 144 for transfer substrates between exterior robots and the heated substrate support assembly 132 and for providing a symmetrical processing environment in the upper chamber volume 120. The lift hoop assembly 144 include a ring-shaped hoop body 146 disposed within the upper chamber volume 120 around the heated substrate support assembly 132. The hoop body 146 is coupled to a lift 160 disposed in an outer region of the upper chamber volume 120. The lift 160 moves the hoop body 146 vertically within the upper chamber volume 120.

A hoop liner 145 is attached to the hoop body 146. The hoop liner 145 extends vertically upwards from the hoop body 146. In one embodiment, the hoop liner 145 is a ring having a substantially flat cylindrical inner wall 145a. In one embodiment, the inner wall 145a of the hoop liner 145 has a height 145b much greater than the thickness of the heated substrate support assembly 132 and an inner diameter greater than the outer diameters of the heated substrate support assembly 132 and the showerhead 129 so that the hoop liner 145 can create a processing environment around the heated substrate support assembly 132 and the showerhead 129 when the hoop liner 145 is in the lowered position. The cylindrical inner wall 145a of the hoop liner 145 creates a circular confinement wall within the upper chamber volume 120 around the substrate 104 and the region immediately above the heated substrate support assembly 132, therefore, providing a symmetrical processing environment for the substrate 104.

Three or more lifting fingers 147 are attached to the hoop body 146. The lifting fingers 147 extend vertically downwards and radially inwards from the hoop body 146. The lifting fingers 147 are configured to transfer substrates between the heated substrate support assembly 132 and substrate transfer devices, such as robots, outside the upper chamber volume 120. Tips 147a of the lifting fingers 147 form a substrate support surface configured to support the substrate 104 at several points near an edge region of the substrate 104.

FIG. 1 shows the lift hoop assembly 144 in a lower position for substrate processing. As the hoop body 146 rises to the upper position, the lifting fingers 147 move to contact with and lift the substrate 104 from the heated substrate support assembly 132. While the hoop body 146 is at the upper position, external substrate transferring device (not shown) can enter the upper chamber volume 120 through one of the ports to remove the substrate 104 from the lifting fingers 147 and subsequently place a new substrate 104 onto the lifting fingers 147. When the hoop body 146 is in the lower position again, the new substrate 104 positioned on the lifting fingers 147 is placed on the heated substrate support assembly 132 for processing.

A more detailed description of the upper and lower chamber bodies can be found in U.S. Provisional Patent Application Ser. No. 61/448,027, filed Mar. 1, 2011, entitled "Abatement and Strip Process Chamber in a Dual Load Lock Configuration".

A more detailed description of the lift hoop assembly 144 can be found in U.S. Provisional Patent Application Ser. No. 61/448,012, filed Mar. 1, 2011, entitled "Method and Apparatus for Substrate Transfer and Radical Confinement".

The heated substrate support assembly 132 is configured to fit in the upper chamber volume 120 of the dual load lock chamber 100. The heated substrate support assembly 132 is installed to be substantially thermally insulated from the chamber body 103. In one embodiment, the heated substrate support assembly 132 is configured to heat the substrate 104 up to 300 degrees Celsius while the chamber body 103 remains cool, for example, the chamber body 103 remains at a temperature below 65 degrees Celsius.

The heated substrate support assembly 132 has a plate and cantilever arm configuration to fit in a small chamber volume. The heated substrate support assembly 132 generally includes a heated plate 132b for supporting the substrate 104, and a cantilever tube 136 extending from the heated plate 132b.

In one embodiment, the heated plate 132b may include an upper heater plate 133, a lower heater plate 134 attached to the upper heater plate 133, and a heater 135 disposed between the upper heater plate 133 and the lower heater plate 134. In one embodiment, the heater 135 may be disposed in channels formed on an upper surface of the lower heater plate 134 and/or a lower surface of the upper heater plate 133. The heater 135 may be a resistive heater or conduits arranged to flow a heat transfer fluid. The upper heater plate 133 and the lower heater plate 134 may be joined together by bolts, welding or brazing. In one embodiment, the upper heater plate 133 and the lower heater plate 134 may be formed from metal, such as aluminum. The upper heater plate 133 and the lower heater plate 134 may have the same thickness so that the heated substrate support assembly 132 does not warp upon heating.

The upper heater plate 133 is configured to support the backside 104b of the substrate 104. In one embodiment, the lower heater plate 134 has an outer diameter larger than the outer diameter of the upper heater plate 133. A focus ring 151 may be disposed on an outer edge 134a of the lower heater plate 134 exposed radially outwards of the upper heater plate 133. The focus ring 151 surrounds the upper heater plate 133 and the substrate 104 disposed thereon. The focus ring 151 functions to retain the substrate 104 and to modify processing rate around an edge area of the substrate 104 during processing. In one embodiment, the focus ring 151, the upper and lower heater plates 133, 134 may have matching cut outs 155 configured to provide passage for lift fingers 147.

The heated substrate support assembly 132 does not directly contact the chamber body 103 to reduce thermal exchange with the chamber body 103. In one embodiment, the heated substrate support assembly 132 is mounted on a thermal insulator 143 disposed on the upper wall 118 of the lower chamber body 111 through a central opening 123a in the bottom wall 123 of the upper chamber body 121. In one embodiment, a recess 118a may be formed on the upper wall 118 of the lower chamber body 111. The recess 118a may allow vacuum ports formed in the lower chamber body 111 to connect with the upper chamber volume 120. The thermal insulator 143 may be formed from a thermal insulative material, such as a ceramic, to prevent thermal exchange between the heated substrate support assembly 132 and the chamber body 103 including both the upper chamber body 121 and the lower chamber body 111.

The thermal insulator 143 is positioned to center the heated substrate support assembly 132 relative to other components in the upper chamber volume 120, for example the showerhead 129, and the lift hoop assembly 144. In one embodiment, the thermal insulator 143 aligns with a central axis 132a of the heated substrate support assembly 132 to ensure that the heated substrate support assembly 132 remains centered during thermal expansion.

The cantilever tube 136 extends from a backside 134b near the center of the lower heater plate 134. The cantilever tube 136 extends radially outwards to connect with an extension tube 137 disposed through an opening 153 of the upper chamber body 121 and an opening 152 of the lower chamber body 111. In one embodiment, the extension tube 137 may be extended vertically downward from the cantilever tube 136. The tubes 136, 137 do not contact (e.g., are spaced apart from) the upper chamber body 121 or the lower chamber body 111 to further avoid heat exchange between the heated substrate support assembly 132 and the chamber bodies 111, 121. The cantilever tube 136 and the extension tube 137 provide a passage for power supplies, sensors and other wiring to be used by the heated substrate support assembly 132. In one embodiment, a heater power source 138, a sensor signal receiver 139 and a chucking control unit 140 are wired to the heated substrate support assembly 132 through the passage in the cantilever tube 136 and the extension tube 137. In one embodiment, the chucking control unit 140 is configured to provide a vacuum chucking mechanism.

A cooling adaptor 141 is coupled to the extension tube 137 from outside of the lower chamber body 111. The cooling adaptor 141 has cooling channels 141a formed therein. A source for cooling fluid 142 is connected to the cooling channels 141a to provide cooling to the cooling adaptor 141 and the extension tube 137, the cantilever tube 136, and other components of the heated substrate support assembly 132. The cooling adapter 141 generally stays cool during processing, thus, functioning as a thermal insulator between the heated substrate support assembly 132 and the chamber body 103.

In one embodiment, bi-metal connectors may be used for connecting various parts of the heated substrate support assembly 132 to provide thermal breaks which substantially reduces heat transfer between the heated substrate support assembly 132 and the chamber body 103. The reduced heat transfer between the heated substrate support assembly 132 and the chamber body 103 allows for faster heater response time, more accurate temperature control and less wattage needed to heat and maintain the temperature of the substrate support assembly 132.

Figure 2:
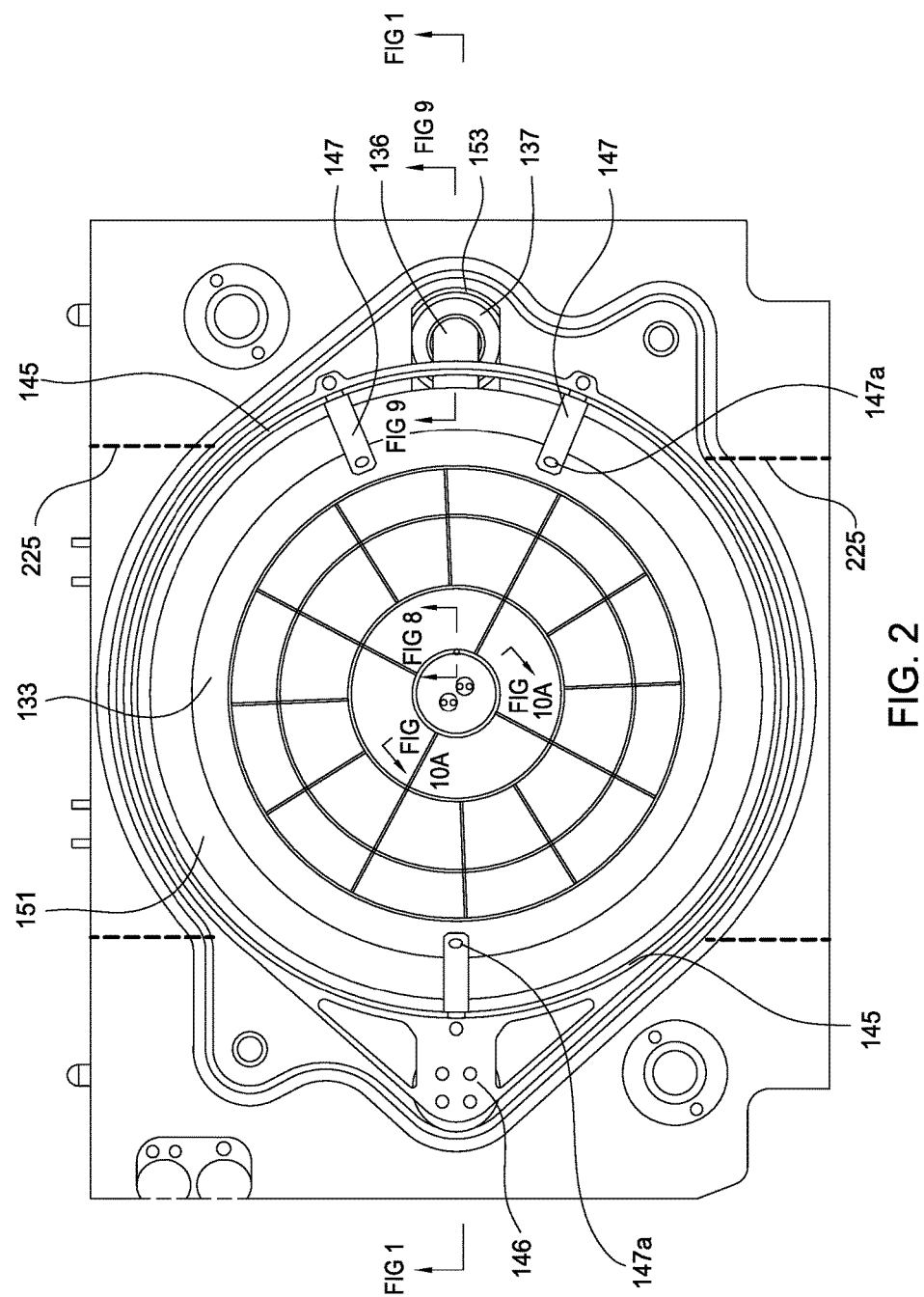
FIG. 2 is a schematic top view of a load lock chamber having a heated substrate support assembly according to one embodiment of the present invention.

FIG. 2 schematically illustrates a top view of dual load lock chamber 100 with the showerhead 129 removed showing a top view of the heated substrate support assembly 132. Two openings 225 are formed through the sidewalls 124 to allow substrate transferring and passage of external robots. A slit valve door may be attached outside of each opening 225 thus providing interface between the upper chamber volume 120 and two processing environments.

Figure 3:
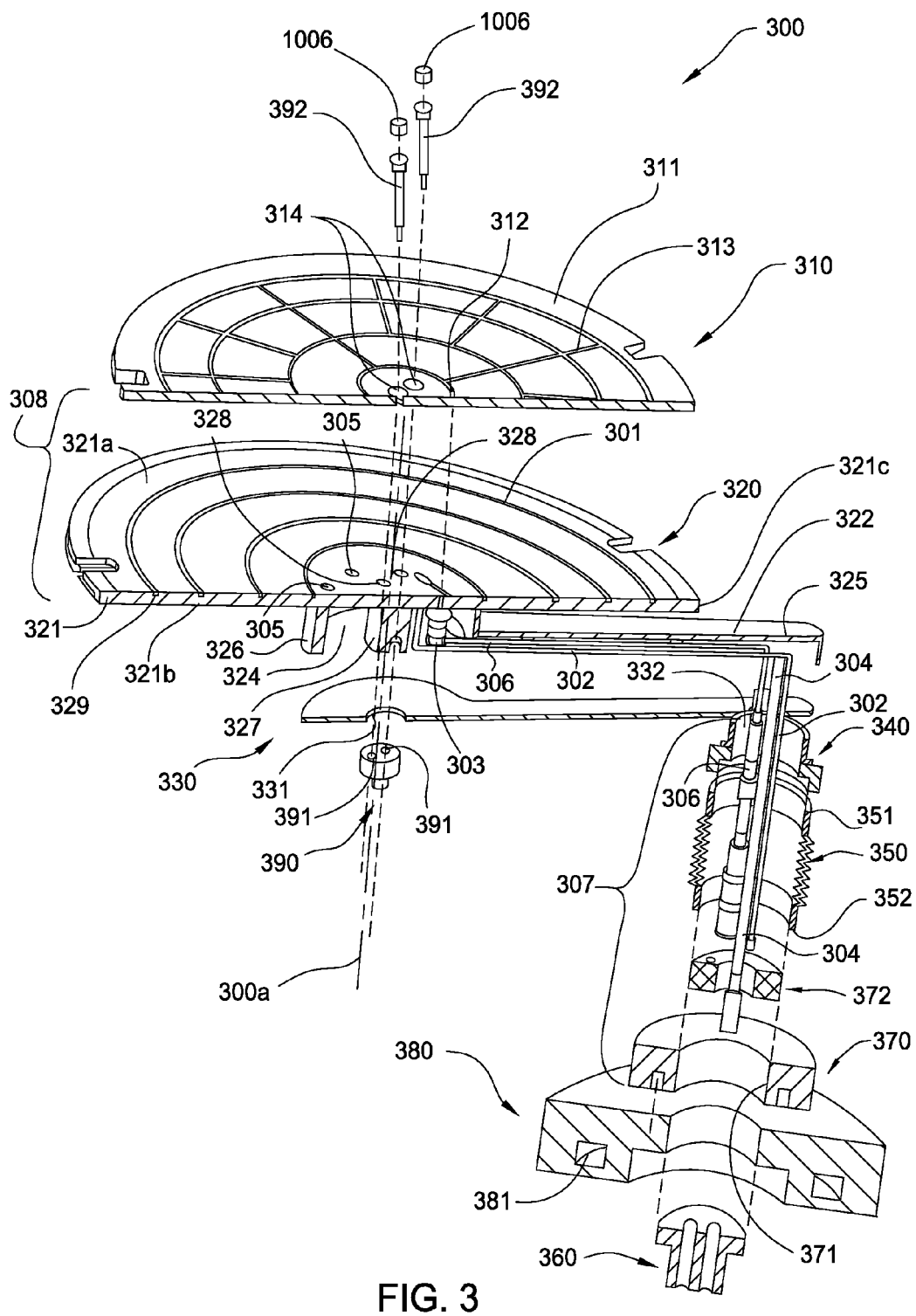
FIG. 3 is an exploded view of a heated substrate support assembly according to one embodiment of the present invention.

FIG. 3 is an exploded view of a heated substrate support assembly 300 according to one embodiment of the present invention. The heated substrate support assembly 300 may be utilized as the heated substrate support assembly 132. The heated substrate support assembly 300 generally has a substrate supporting plate supported by a cantilever structure.

The heated substrate support assembly 300 includes an upper heater plate 310 having a substrate supporting surface 311. The upper heater plate 310 has a substantially disk shape. The substrate supporting surface 311 is substantially planar for contacting a substrate. A vacuum chuck opening 312 is formed through the upper heater plate 310. A web of chucking channels 313 are formed on the substrate supporting surface 311. The chucking channels 313 are fluidly connected to the vacuum chuck opening 312 to allow removal of air or gas between a substrate and the substrate supporting surface 311.

In one embodiment, one or more openings 314 may be formed through the upper heater plate 310 near the center to allow the heated substrate support assembly 300 to be bolted to a processing chamber.

The heated substrate support assembly 300 includes a lower heater plate 320 having a disk shaped body 321 and a hollow column 326. The upper heater plate 310 is attached to an upper side 321a of the body 321. The upper heater plate 310, the body 321 of the lower heated plate 320, and a heating element 301 form a heated plate 308 for supporting and heating a substrate thereon.

The upper heater plate 310 and the lower heater plate 320 are joined together with the heating element 301 embedded therebetween. The heating element 301 may be arranged in a channel formed in the lower heater plate 320 and/or the upper heater plate 310 to uniformly heat a substrate on the upper heater plate 310. In one embodiment, as shown in FIG. 3, a spiral shaped channel 329 is formed in the upper side 321a of the body 321 of the lower heater plate 320. A sensing assembly 305 including one or more sensors may also be embedded between the upper and lower heater plates 310, 320.

The upper heater plate 310 and the lower heater plate 320 may be joined by various methods, for example by bolting, welding or brazing. The upper heater plate 310 and the lower heater plate 320 are generally formed for thermally conductive material, such as metals. In one embodiment, both the upper heater plate 310 and the lower heater plate 320 are formed from aluminum with improved uniformity in heating. The aluminum upper heater plate 310 and lower heater plate 320 may be joined together by brazing.

The hollow column 326 extends from a lower side 321b of the body near a center axis 323 of body 321 of the lower heater plate 320. A cantilever arm 322 extends from the hollow column 326 radially outwards. The cantilever arm 322 is substantially parallel to the upper and lower heater plates 310, 320. In one embodiment, a distal end 325 of the cantilever arm 322 may extend radially outside an outer edge 321c of the body 321.

The cantilever arm 322 and the hollow column 326 form a recess 324 for housing the wirings to the upper and lower heater plates 310, 320. In one embodiment, the recess 324 holds a heating lead 302 connected to the heating element 301 disposed on the lower heater plate 320, a pumping pipe 304 connected to the vacuum chuck opening 312 through a pumping joint 303, and a sensor lead 306 connected to the sensing assembly 305 on the upper heater plate 310 and/or the lower heater plate 320.

In one embodiment, a central column 327 extends from the backside 321b of the body 321 within the hollow column 326 along the central axis 323. In one embodiment, one or more openings 328 may be formed through the central column 327 for bolting the lower heater plate 320 to a processing chamber or components of a processing chamber.

A back cover 330 is attached to the lower heater plate 320 to close the recess 324 so that the wirings inside the recess 324 are not exposed to the processing environment. The back cover 330 and the lower heater plate 320 may be formed from the same material to obtain a uniform temperature profile and to reduce deformation in the joint structure caused by thermal expansion. In one embodiment, both the back cover 330 and the lower heater plate 320 are formed from aluminum and joined together by welding.

The back cover 330 may have an opening 331 to allow the lower heater plate 320 to contact a thermal isolator 390, which anchors the heated substrate support assembly 300 in a processing chamber without direct contact. In one embodiment, the thermal isolator 390 has one or more openings 391 formed therein to allow the upper and lower heater plates 310, 320 attached by bolting. The upper and lower heater plates 310, 320 may be attached to the thermal isolator 390 or to a processing chamber through the thermal isolator 390. The embodiment shown in FIG. 3, screws 392 may be used to bolt the upper and lower heater plates 310, 320 to the thermal isolator 390 through openings 314, 328 and 391.

The back cover 330 may include an opening 332 near the dismal end of the cantilever arm 322. The opening 332 allows the heating lead 302, the pumping pipe 304, and the sensor lead 306 to exit the recess 324.

In one embodiment, a joint 340 is connected to the back cover 330 around the opening 332. The joint 340, a bellows 350, and a flange 370 form an extension tube 307 extending from the cantilever arm 322. The extension tube 307 is configured to house the heating lead 302, the pumping pipe 304, and the sensor lead 306 within a processing environment.

The joint 340 is configured to structurally connect the cantilever arm 322 of the lower heater plate 320 and an upper end 351 of the bellows 350. The bellows 350 provides flexibility to accommodate changes in size and shape of the cantilever arm 322, the joint 340 and the flange 370 caused by temperature change.

In one embodiment, the bellows 350 are formed from material with tensile strength suitable for standing high stress level in the convolutions of the bellows 350. In one embodiment, the bellows 350 is formed from stainless steel.

In one embodiment, the joint 340 is a stainless steel and aluminum bi-metal joint configured to join the stainless bellows 350 and the aluminum cantilever arm 322. The bi-metal joint allows the heated substrate support assembly 300 to have the superb thermal conductivity of aluminum in the heating portion and the strength of stainless steel in the structural supporting portion. Additionally, the bi-metal joint allows for faster heater response time, more accurate temperature control and less wattage needed to heat and maintain the temperature of the heated substrate support assembly 300.

The flange 370 is attached to a lower end 352 of the bellows 350. The flange 370 may be formed from the same material as the bellows 350, for example formed from stainless steel. The flange 370 may have a central opening 371 to allow the heating lead 302, the pumping pipe 304 and the sensing lead 306 passing therethrough. In one embodiment, an insert 372 may be disposed within the central opening 371 to provide a seal.

A tube guide 360 may be disposed under the insert 372 along the at least one of the heating lead 302, the pumping pipe 304 and the sensing lead 306 to provide guide and additional cooling. In one embodiment, the tube guide 360 may be formed from aluminum and bolted to the flange 370.

When the heated substrate support assembly 300 is installed in a processing chamber, the flange 370 is configured to dispose in a chamber opening without contacting the chamber so that no direct thermal exchange occurs between the heated substrate support assembly 300 and the chamber body.

A cooling adaptor 380 is configured to attach to the flange 370 and the chamber body from outside the chamber. The cooling adaptor 380 may have one or more cooling channels 381 formed therein and connected to a cooling fluid source. The cooling adaptor 380 thermally connects the chamber body and the heated substrate support assembly 300. Therefore, any heat from the flange 370 of the heated substrate support assembly 300 maybe absorbed by the cooling fluid in the adaptor 380 before propagating towards the chamber body. Therefore, the cooling adaptor 380 acts as thermal insulation between the heated substrate support assembly 300 and the chamber body.

Figure 4:
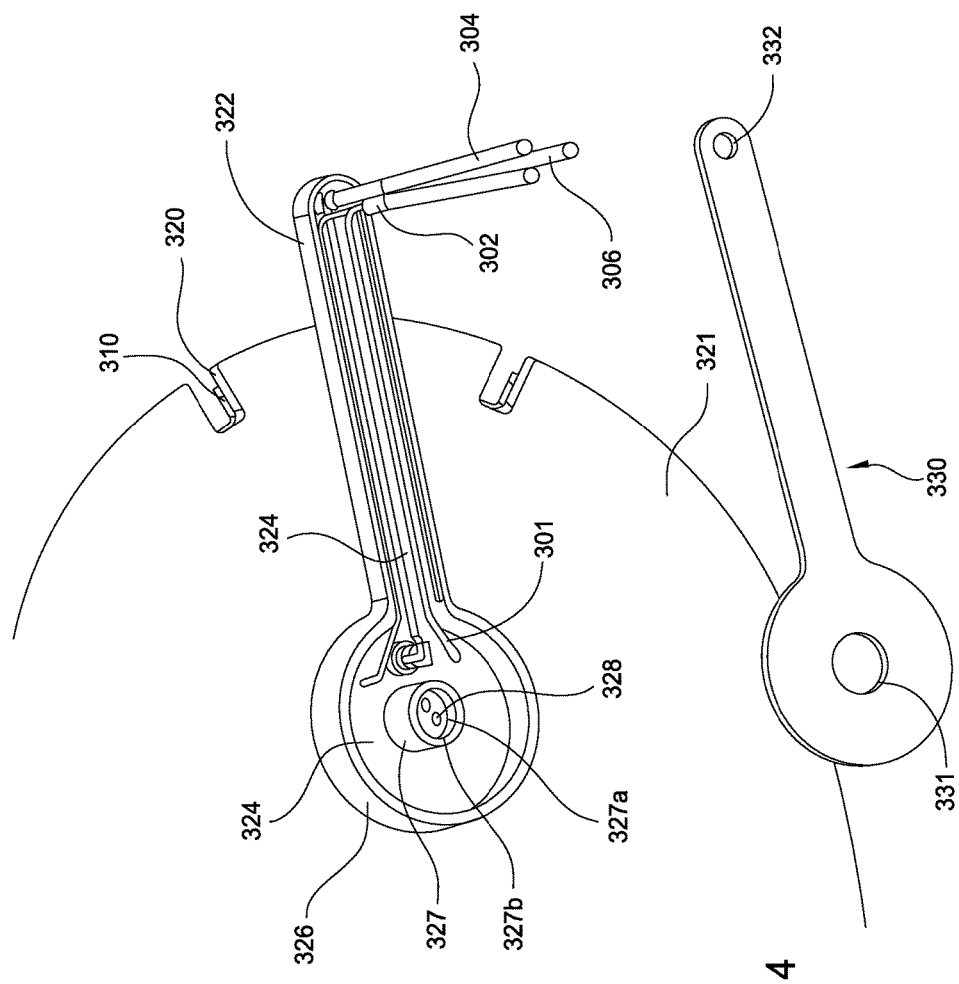
FIG. 4 is a partial exploded view of the heated substrate support assembly of FIG. 3.

FIG. 4 is a partial exploded bottom view of the heated substrate support assembly 300 of FIG. 3. As shown in FIG. 4, the heating lead 302, the pumping pipe 304 and the sensing lead 306 are disposed in the recess 324 formed by the cantilever arm 322 and the hollow column 326. A lower opening 327a may be formed in a lower surface 327b of the central column 327. The lower opening 327a matches and receives the thermal isolator 390. Even though the lower opening 327a is described for matching with the thermal isolator 390, other structures, for example dowel pins, notches, may be used to achieve the purpose.

Figure 5A:
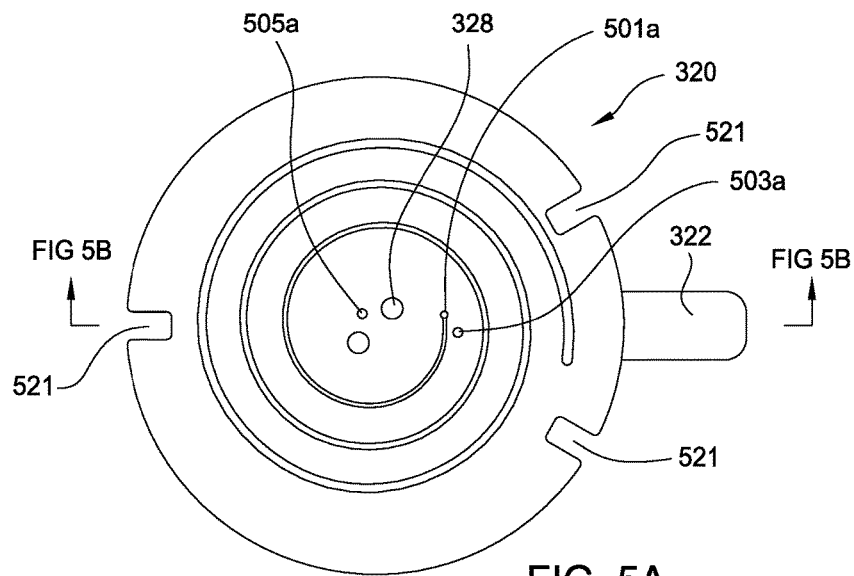
FIG. 5A is a top view of a lower plate for a heated substrate support assembly according to one embodiment of the present invention.
Figure 5B:
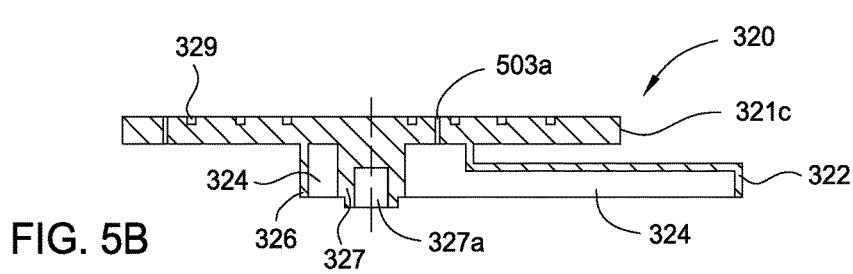
FIG. 5B is a sectional view of the lower plate of FIG. 5A.
Figure 5C:
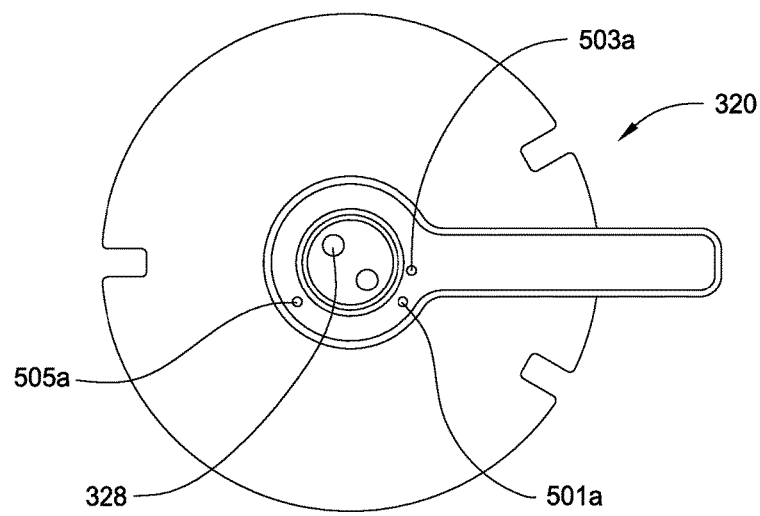
FIG. 5C is a bottom view of the lower plate of FIG. 5A.

FIGS. 5A, 5B, and 5C are top view, sectional view, and bottom view of the lower heater plate 320 respectively according to one embodiment of the present invention. A through hole 501a is formed through the body 321 to allow the heating element 301 entering into the channels 329 formed in the top surface 321a of the body 321. A through hole 503a is formed through the body 321 to connect with the pumping joint 303. One or more sensing holes 505a may be formed through the body 321 to allow the sensing lead 306 to connect with one or more sensors of the sensing assembly 305.

In one embodiment, three or more notches 521 may be formed along the edge 321c of the body 321 to allow passage of a substrate transfer device, such as the lifting fingers 147 of the dual load lock chamber 100 to a level below the substrate support surface of the body 321. In one embodiment, three notches 521 are formed through the body 321 with one notch 521 positioned on one side and the other two notches 521 positioned in on the opposite side proximate the cantilever arm 322. The two notches 521 allow the lifting fingers 147 to pass below the substrate support surface of the body 321 and set the substrate on the substrate support surface of the body 321.

FIG. 6 is a schematic perspective view of the wiring without surrounding structures of the heated substrate support assembly 300 according to one embodiment of the present invention.

In one embodiment, the heating element 301 is winded in a substantially planar spiral pattern for providing a uniform heating across the substrate supporting surface 311 of the upper heater plate 310.

FIG. 7 is a schematic sectional view of the heating element 301 according to one embodiment of the present invention. The heating element 301 generally includes a heater wire 701 forming a loop within a sheath 702. Insulation 703 is filled within the sheath 702. In one embodiment, the heater wire 701 may have a resistance of about 24.7 ohms at 70 degrees Fahrenheit. The heater wire 701 may be configured to have a heating power of about 2100 watts at 230 volts. The insulation 703 may have a resistance of greater than 1000 mega ohms at 70 degrees Fahrenheit under about 500 volts. In one embodiment, the sheath 702 may be formed from a high temperature alloy, for example from INCONEL® 600. While assembled, a heated portion 704 wherein the heater wire 701 is looped is disposed within the channels 329 of the lower heater plate 320 and a cool portion 705 where no resistive heater wire is present is disposed within the recess 324. An end closure 707 may be used to join the heater wire 701 and leads 706, which is configured to connect with a power source. In one embodiment, the end closure 707 is formed from ceramic cement potting and epoxy seal.

The sensing assembly 305 may include one or more sensors disposed in the upper heater plate 310 and/or the lower heater plate 320. In one embodiment, the sensing assembly 305 may include a thermal couple configured to measure temperature of the upper heater plate 310 and/or the lower heater plate 320.

The pumping joint 303 is configured to provide a vacuum sealed connection between the pumping pipe 304, the through holes 503a and the vacuum chuck opening 312 of the lower and upper heater plates 320 and 310.

The pumping pipe 304 is generally formed from stainless steel. In the embodiments which the lower heater plate 320 is formed from aluminum, the pumping joint 303 is formed from aluminum-stainless steel bi-metal. The bi-metal pumping joint 303 contributes to the thermal isolation of the heated substrate support assembly 300.

Figure 8:
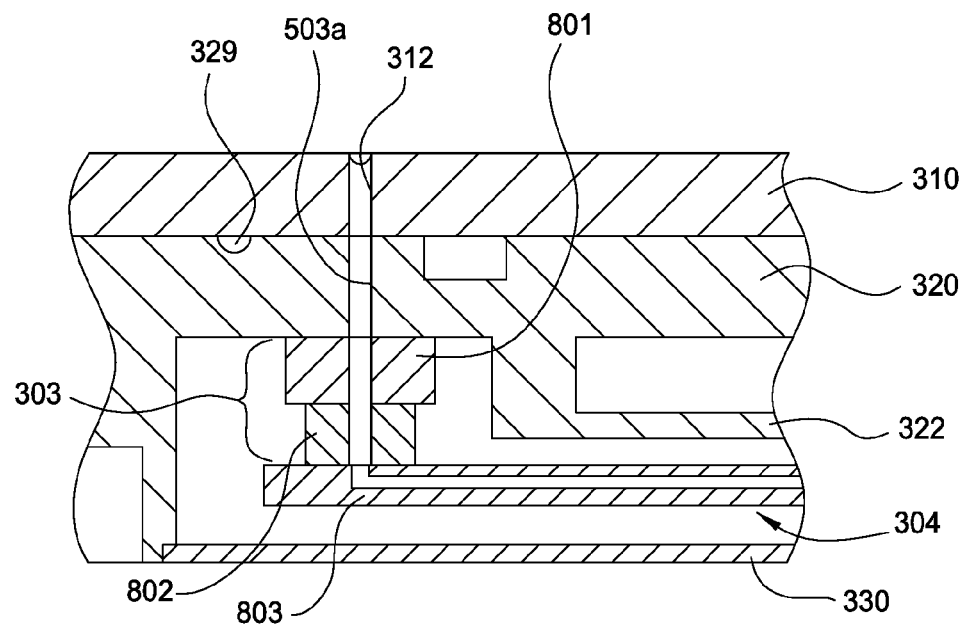
FIG. 8 is a partial sectional view showing a bi-metal connection in a vacuum path in the heated substrate support assembly according to one embodiment of the present invention.

FIG. 8 is a partial sectional view showing a bi-metal pumping joint 303 in the heated substrate support assembly 300 according to one embodiment of the present invention. The bi-metal pumping joint 303 includes a first portion 801 formed from a first metal, and a second portion 802 formed from a second metal, different from the first metal. The first portion 801 and the second portion 802 may be bolded by explosion welding. In explosion welding, two dissimilar metals are forced together using the energy of detonating explosive that exerts a pressure of several million pounds per square inch resulting in a welding bond which is stronger than the weaker one of the two dissimilar metals.

In one embodiment, the first portion 801 is formed from aluminum, and the second portion 802 from stainless steel. The aluminum first portion 801 can be welded on the back surface of the 321b of the lower heater plate 320, which is made of aluminum. The stainless steel second portion 802 can be welded with a horizontal portion 803 of the pumping pipe 304 which is formed by stainless steel. As a result, the bi-metal pumping joint 303 allows the stainless steel pumping pipe 304 to bond with the aluminum lower heater plate 320. By using the bi-metal pumping joint 303, the lower heater plate 320 contacts only aluminum which helps maintaining temperature uniformity and the pumping pipe 304 can be made by stainless steel which provides strong structure support for the vacuum channel therein.

Figure 9:
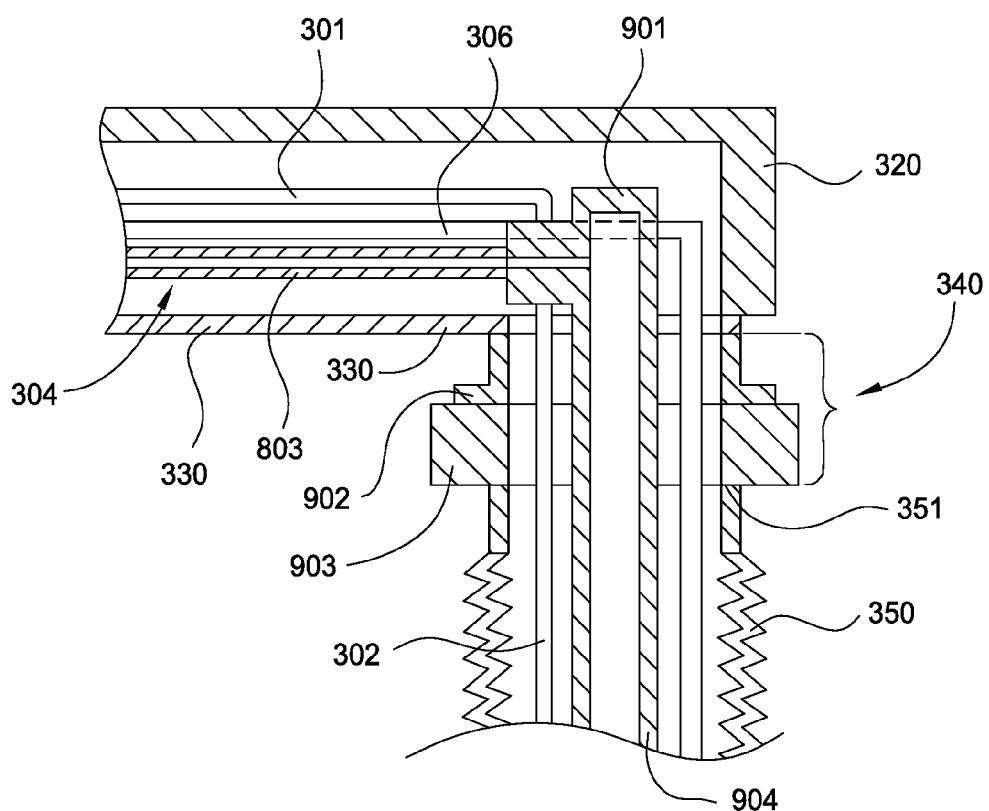
FIG. 9 is a partial sectional view showing a bi-metal connection in an extension tube of the heated substrate support assembly according to one embodiment of the present invention.

As discussed above, the joint 340 may also be a bi-metal joint used to join two dissimilar metals. FIG. 9 is a partial sectional view showing a bi-metal connection in an extension tube of the heated substrate support assembly 300 according to one embodiment of the present invention. The joint 340 may include a first portion 902 formed from aluminum, and a second portion 903 formed from stainless steel. The aluminum first portion 902 can be welded onto the back cover 330, which is made of aluminum. The stainless steel second portion 903 can be welded onto the upper end 351 of the bellows 350, which is formed by stainless steel. The bi-metal joint 340 allows stainless steel structures, which are strong and flexible, to connect bond with the aluminum lower heater plate 320, which provides uniform heating. The bi-metal joint 340 also contributes to the thermal isolation of the substrate support 300, the advantages of which have been discussed above.

Also shown in FIG. 9, an elbow 901 may be used to join the horizontal portion 803 and the vertical portion 904 of the pumping pipe 304.

The heated substrate support assembly 300 according to embodiments of the present invention also improves thermal insulation between the heated components and the chamber body in which the heated substrate support assembly 300 is installed. Particularly, the heated substrate support assembly 300 does not directly contact a chamber body in which it is installed.

Figure 10A:
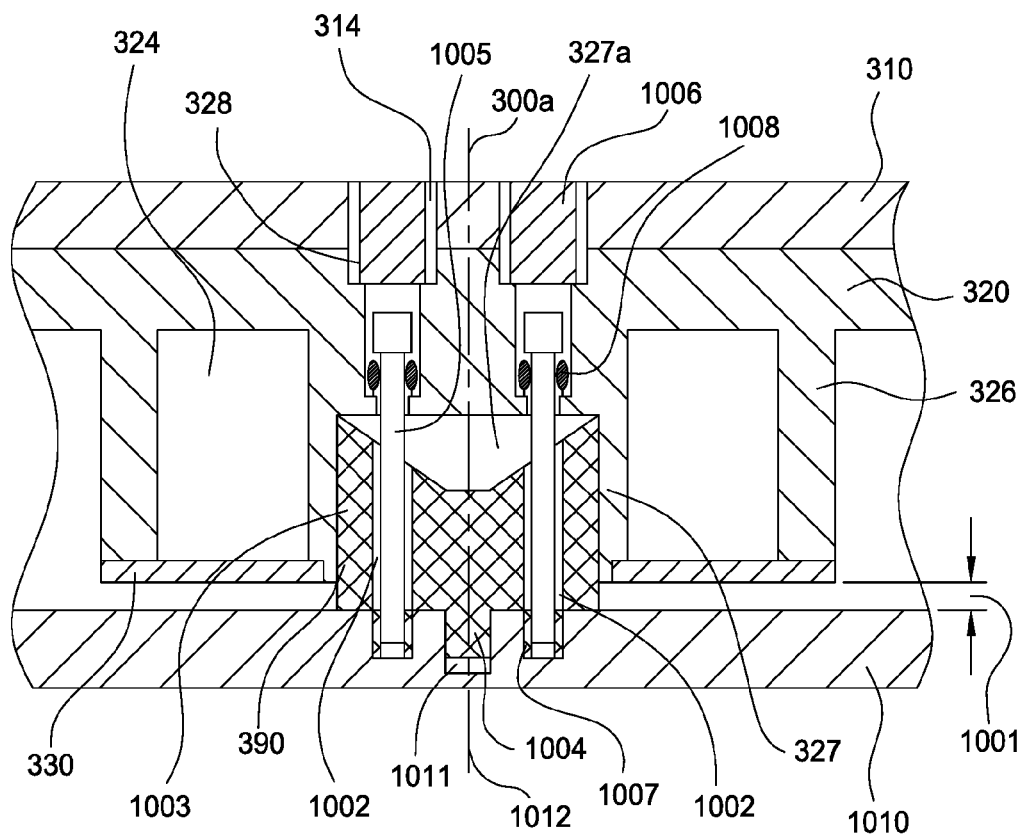
FIG. 10A is a partial sectional view showing a thermal insert according one embodiment of the present invention.
Figures 10B, 10C:
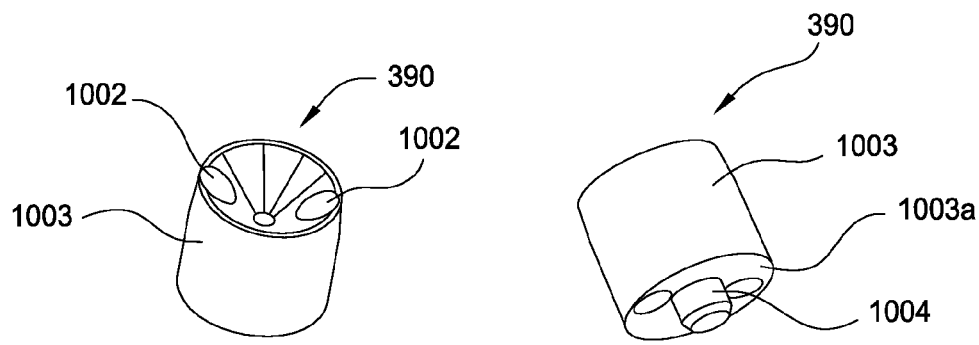
FIGS. 10B and 10C are perspective views of the thermal insert shown in FIG. 10A.

The thermal isolator 390 is used to position the heated substrate support assembly 300 within a chamber body. FIG. 10A is a partial sectional view showing the thermal isolator 390 and the heated substrate support assembly 300 disposed on a chamber body 1010. FIGS. 10B and 10C are perspective views of the thermal isolator 390 according one embodiment of the present invention.

The thermal isolator 390 may include an upper portion 1003 configured to align with the heated substrate support assembly 300 and a lower portion 1004 configured to align with the chamber body 1010. In one embodiment, the upper portion 1003 has a substantially cylindrical shape and the lower portion 1004 also has a substantially cylindrical shape. The upper portion 1003 may fit in the lower opening 327a of the lower heater plate 320 and the lower portion 1004 may fit in a recess 1011 formed in the chamber body 1010. The upper portion 1003 may have a larger diameter than the lower portion 1004 to allow a bottom surface 1003a of the upper portion 1003 to rest on the chamber body 1010. The height of the upper portion 1003 is longer than the depth of the lower opening 327a of the lower heater plate 320 so that when the heated substrate support assembly 300 rests on the thermal isolator 390 as shown in FIG. 10A, a gap 1001 is formed between the chamber body 1010 and the heated substrate support assembly 300. As a result, the heated substrate support assembly 300 does not directly contact the chamber body 1010. In one embodiment, the gap 1001 is about 0.1 inch.

In one embodiment, the lower opening 327a may be in-line (i.e., concentric) with a central axis 300a of the heated substrate support assembly 300 and the recess 1011 may formed in-line with a central axis 1012 of the chamber body 1010, thus, the thermal isolator 390 aligns the central axis 300a of the heated substrate support assembly 300 with the central axis 1012 of the chamber body 1010. This configuration of central alignment allows unrestricted radial thermal expansion of the heated substrate support assembly 300 within displacement relative to the central axis, thus, enhancing process uniformity of substrates processed within the processing chamber.

In one embodiment, one or more through holes 1002 may be formed through the thermal isolator 390 to allow one or more screws 1005 passing through. The one or more screws 1005 may be used to bolt the heated substrate support assembly 300 onto the chamber body 1010.

Each one of the one or more screws 1005 may be bolted to the chamber body 1010 through a thermal liner 1007. An insulator 1008 may be disposed between the screw 1005 and the lower heater plate 320. In one embodiment, screw covers 1006 may be disposed within the openings 314 and 328 of the upper and lower heater plates 310 and 320 to cover the screws 1005.

The thermal isolator 390, the insulators 1008, and the thermal liners 1007 are formed from thermal insulative material, such as a ceramic. In one embodiment, the screws 1005 may be formed from titanium. The screw covers 1006 may be formed from the same material as of the upper heater plate 310, such as aluminum.

Embodiments of the present invention also provide a cooling adaptor to connect between the chamber body and components of the heated substrate support assembly at the exit point of the heated substrate support assembly to avoid direct contact between the heated substrate support assembly and the chamber body.

Figure 11A:
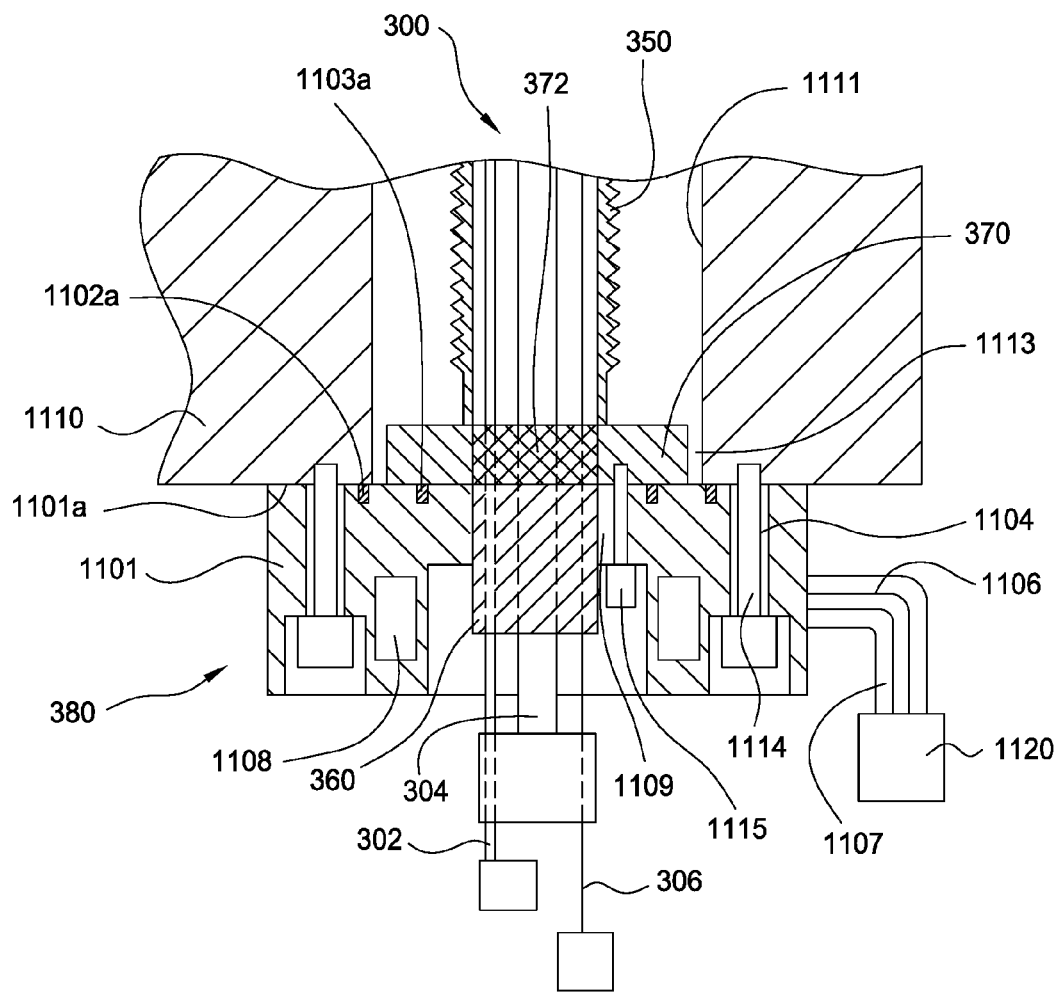
FIG. 11A is a partial sectional view showing a cooling adaptor according to one embodiment of the present invention.
Figure 11B:
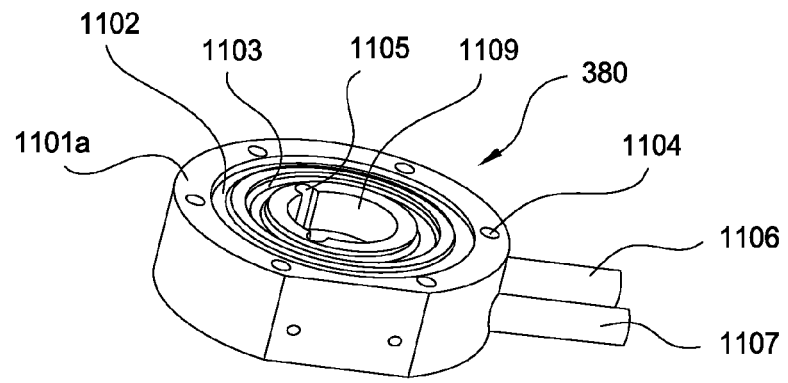
FIG. 11B is a perspective view of the cooling adaptor shown in FIG. 11A.

FIG. 11A is a partial sectional view showing the cooling adaptor 380 connecting with a chamber body 1110 and the flange 370 of the heated substrate support assembly 300 according to one embodiment of the present invention. FIG. 11B is a perspective view of the cooling adaptor 380.

The cooling adaptor 380 has a cooling body 1101. The cooling body 1101 may be formed from a thermal conductive material, such as stainless steel or aluminum. In one embodiment, the body 1101 may be substantially cylindrical having an upper surface 1101a configured for contacting the flange 370 of the heated substrate support assembly 300 and a chamber body 1110 of the processing chamber the heated substrate support assembly 300 is disposed in. Two glands 1102, 1103 may be formed on the upper surface 1101a. The glands 1102, 1103 are configured to receive sealing rings 1102*a*, 1103*a* to form vacuum seal with the chamber body 1110 and with the flange 370 respectively.

A central opening 1109 is formed through the cooling body 1101 to allow the heating lead 302, the pumping pipe 304 and the sensing lead 306 of the heated substrate support assembly 300 to exit. Screw holes 1104 may be formed near an outer portion of the cooling body 1101 so that the cooling body 1101 can be bolted to the chamber body 1110 using screws 1114. Screw holes 1105 may be formed in the cooling body 1101 near the central opening 1109 so that the flange 370 can be attached to the cooling body 1101 by screws 1115.

A cooling channel 1108 is formed within the cooling body 1101. The cooling channel 1108 is connected to an inlet 1106 and an outlet 1107. The inlet 1106 and the outlet 1107 may be connected to a cooling fluid source 1120 so that cooling fluid may be circulated within the cooling channel 1108 to control the temperature of the cooling body 1101.

The heated substrate support assembly 300 is disposed within the chamber body 1110 and the heating lead 302, the pumping pipe 304, and the sensing lead 306 exit the chamber body 1110 through an opening 1111 formed through the chamber body 1110. The opening 1111 is large enough to accommodate the flange 370 that a gap 1113 is formed between the flange 370 and other components of the heated substrate support assembly 300 and the chamber body 1110. The gap 1113 ensures substantially no thermal conduction between the flange 370 and chamber body 1110.

The cooling adaptor 380 is disposed outside the chamber body 1110. In one embodiment, the central opening 1109 of the cooling adaptor 380 is aligned with the opening 1111 of the chamber body 1110 so that the cooling body 1101 covers the opening 1111 in the chamber body 1110 and the flange 370 of the heated substrate support assembly 300 is attached to the cooling body 1101.

In this configuration, the temperature controlled cooling body 1101 directly contacts the chamber body 1110 and the heated substrate support assembly 300 while the chamber body 1110 and the heated substrate support assembly 300 do not contact each other. Any heat from the flange 370 of the heated substrate support assembly 300 is first absorbed by the cooling body 1101 which exchanges thermal energy with the cooling fluid in the cooling channel 1108. Therefore, the cooling adaptor 380 acts as thermal insulation between the heated substrate support assembly 300 and the chamber body 1110.

Thermal simulations demonstrate that by flowing water at 25 degree Celsius to the cooling channels 1108, the temperature of the chamber body 1110 can be maintained lower than 65 degrees Celsius when the heated substrate support assembly 300 is at a temperature of about 300 degrees Celsius.

Even though embodiments of the present invention are described above in application of load lock chambers, embodiments of the present invention can be applied to any process chamber. Particularly, embodiments of the present invention are useful in chambers having small processing area or two or more openings for substrate transfer.

While the foregoing is directed to embodiments of the present invention, other and further embodiments of the invention may be devised without departing from the basic scope thereof, and the scope thereof is determined by the claims that follow.

What is claimed is:

1. A substrate support assembly, comprising:
   a heated plate having a front side and a backside, the front side including a substrate supporting surface;
   a heating element disposed in the heated plate;
   a cantilever arm extending from the backside of the heated plate, wherein the cantilever arm has a first end attached to the heated plate near a central axis of the heated plate, and a second end extending radially outwards from the central axis;
   a pumping pipe disposed in a passage formed in the cantilever arm; and
   a bi-metal joint disposed on the backside of the heated plate, wherein the bi-metal joint couples to the pumping pipe and is configured to thermally isolate the heated plate from the pumping pipe, wherein the bi-metal joint comprises a first portion formed from a first metal and a second portion formed from a second metal dissimilar to the first metal.

2. The substrate support assembly of claim 1 further comprising:
   a thermal isolator coupled to the backside of the heated plate at the central axis of the heated plate, wherein the thermal isolator extends through an opening in the cantilever arm.

3. The substrate support assembly of claim 1, further comprising an extension tube attached to the cantilever arm near the second end, wherein a second bi-metal joint connects between the cantilever arm and the extension tube, the heated plate and the cantilever arm are formed from the first metal and the extension tube is formed from the second metal.

4. The substrate support assembly of claim 3, wherein the first metal is aluminum and the second metal is stainless steel.

5. The substrate support assembly of claim 3, wherein the extension tube comprises a bellows.

6. The substrate support assembly of claim 3, further comprising:
   a bellows coupled to the extension tube by the second bi-metal joint.

7. The substrate support assembly of claim 1, wherein the heated plate comprises:
   an upper heated plate forming the substrate supporting surface;
   a lower heated plate attached to the upper heated plate, wherein the heating element is sandwiched between the upper heated plate and the lower heated plate; and
   a heating lead attached to the heating element, the heating lead disposed in a passage formed in the cantilever arm.

8. The substrate support assembly of claim 1, wherein the pumping pipe is fluidly connected to chucking channels formed on the substrate supporting surface.

9. The substrate support assembly of claim 8, wherein the pumping pipe comprises:
   a horizontal tube disposed within a recess formed in the cantilever arm, wherein the heated plate and the horizontal tube are formed from dissimilar metals.

10. The substrate support assembly of claim 1, further comprising:
    one or more sensors disposed in the heated plate; and
    a sensing lead connecting the one or more sensors, wherein the sensing lead is disposed in a passage formed in the cantilever arm.

11. The substrate support assembly of claim 1, further comprising:
    a pumping pipe coupled to the heated plate by the bi-metal joint.

12. The substrate support assembly of claim 1, wherein the first portion and the second portion of the bi-metal joint are coupled together by explosion bond.

13. A method for processing a substrate, comprising:
placing the substrate on a substrate supporting surface of a substrate support assembly, wherein the substrate support assembly is supported by a thermal insert disposed in a processing chamber so that the substrate support assembly does not directly contact a chamber body, and the substrate support assembly comprises:
a heated plate having a front side and a backside, the front side including the substrate supporting surface;
a heating element disposed in the heated plate;
a cantilever arm extending from the backside of the heated plate, wherein the cantilever arm has a first end attached to the heated plate near a central axis of the heated plate, and a second end extending radially outwards from the central axis;
a pumping pipe disposed in a passage formed in the cantilever arm; and
a bi-metal joint disposed on the backside of the heated plate, wherein the bi-metal joint couples to the pumping pipe and is configured to thermally isolate the heated plate form the pumping pipe, wherein the bi-metal joint comprises a first portion formed from a first metal and a second portion formed from a second metal dissimilar to the first metal; and
heating the substrate using the heated plate of the substrate support assembly.

14. The method of claim 13, further comprising cooling the chamber body by supplying a cooling fluid to a cooling adaptor connected to the substrate support assembly and the chamber body.

15. The method of claim 13, further comprising coupling a thermal isolator to the backside of the heated plate at the central axis of the heated plate, wherein the thermal isolator extends through an opening in the cantilever arm.

16. The method of claim 13, further comprising thermally isolating the heated plate using the bi-metal joint.

17. The method of claim 16, further comprising attaching an extension tube to the cantilever arm near the second end, wherein a second bi-metal joint connects between the cantilever arm and the extension tube, the heated plate and the cantilever arm are formed from the first metal and the extension tube is formed from the second.

18. The method of claim 16, further comprising coupling the first portion and the second portion of the bi-metal joint together by explosion bond.

19. The method of claim 16, further comprising attaching a heating lead to the heating element, wherein the heating lead is disposed in a passage formed in the cantilever arm.

* * * * *